(12) United States Patent
Kim et al.

(10) Patent No.: US 12,557,579 B2
(45) Date of Patent: Feb. 17, 2026

(54) DISCHARGE METHOD, DISCHARGE SYSTEM AND SUBSTRATE PROCESSING APPARATUS INCLUDING THE SAME

(71) Applicant: Samsung Display Co., LTD., Gyeonggi-do (KR)

(72) Inventors: Daesoo Kim, Seoul (KR); Jimin Choi, Chungcheongnam-do (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 597 days.

(21) Appl. No.: 17/864,540

(22) Filed: Jul. 14, 2022

(65) Prior Publication Data

US 2023/0052781 A1 Feb. 16, 2023

(30) Foreign Application Priority Data

Aug. 13, 2021 (KR) .................. 10-2021-0107204

(51) Int. Cl.
*H01J 37/32* (2006.01)
*B01D 51/00* (2006.01)
(Continued)

(52) U.S. Cl.
CPC ........ *H01L 21/67017* (2013.01); *B01D 51/00* (2013.01); *B01D 53/1431* (2013.01); *B01D 53/18* (2013.01)

(58) Field of Classification Search
CPC ................ C23C 16/4412; C23C 16/54; C23C 16/45551; C23C 16/545; C23C 14/568;
(Continued)

(56) References Cited

U.S. PATENT DOCUMENTS 6,045,618 A 4/2000 Raoux et al.
6,736,606 B1 5/2004 Ohmi et al.
(Continued)

FOREIGN PATENT DOCUMENTS

EP 0839929 A1 5/1998
EP 1077329 A1 2/2001
(Continued)

OTHER PUBLICATIONS

Capitelli, et al., Decomposition of Al2O3 Particles Injected Into Argon-Nitrogen Induction Plasmas of 1 Atmosphere, Composition & Flame, vol. 15, pp. 23-32 (1970).
(Continued)

*Primary Examiner* — Rudy Zervigon
(74) *Attorney, Agent, or Firm* — CANTOR COLBURN LLP

(57) ABSTRACT

A discharge method includes discharging discharge products including a first discharge gas and solid by-products from a process chamber, in which a substrate processing process is performed in a vacuum state, into an inside of a collection device, collecting the solid by-products in the collection device, introducing a portion of a second discharge gas discharged from a load lock chamber into the collection device, and vaporizing the solid by-products in the collection device and discharging vaporized solid by-products to an outside of the collection device.

13 Claims, 4 Drawing Sheets

(51) Int. Cl.
  *B01D 53/14* (2006.01)
  *B01D 53/18* (2006.01)
  *H01L 21/67* (2006.01)

(58) Field of Classification Search
  CPC ........... C23C 16/4401; H01L 21/67017; H01L 21/6719; H01L 21/67196; H01L 21/67201; H01L 21/67173; H01L 21/67184; H01L 21/6776; H01L 21/67161; H01L 21/67155; H01L 21/67069; H01L 21/67748; H01L 21/67751; H01L 21/67745; H10K 71/811; H10K 71/00; H10K 71/311; B01D 51/00; B01D 53/1431; B01D 53/18; G02F 1/1313; H01J 37/32834; H01J 37/32844
  USPC ........................ 118/719; 156/345.31, 345.32
  See application file for complete search history.

(56) References Cited

U.S. PATENT DOCUMENTS

| | | | | |
|---|---|---|---|---|
| 7,021,903 B2* | 4/2006 | Bailey | ................... | F04D 25/00 |
| | | | | 417/313 |
| 7,278,831 B2* | 10/2007 | Bailey | ............... | H01L 21/67155 |
| | | | | 417/313 |
| 7,647,886 B2* | 1/2010 | Kubista | ............... | C23C 16/4412 |
| | | | | 118/663 |
| 9,970,106 B2* | 5/2018 | Goeres | ................ | C23C 16/4412 |
| 10,808,315 B2* | 10/2020 | Seo | ..................... | C23C 16/4412 |
| 2002/0066535 A1 | 6/2002 | Brown et al. | | |
| 2004/0026037 A1* | 2/2004 | Shinriki | ............ | C23C 16/45561 |
| | | | | 438/785 |
| 2007/0074662 A1* | 4/2007 | Hirota | ................. | C23C 16/4412 |
| | | | | 118/723 R |
| 2010/0061908 A1 | 3/2010 | Smith | | |
| 2010/0126605 A1 | 5/2010 | Stones | | |
| 2012/0222813 A1* | 9/2012 | Pal | ....................... | C23C 16/4412 |
| | | | | 156/345.31 |
| 2018/0073137 A1* | 3/2018 | Xavier | ................ | C23C 16/4405 |
| 2020/0075297 A1* | 3/2020 | Oishi | ................... | H01J 37/32834 |

FOREIGN PATENT DOCUMENTS

| | | |
|---|---|---|
| JP | 05259133 A | 10/1993 |
| WO | 2020235873 A1 | 11/2020 |

OTHER PUBLICATIONS

Extended European Search Report for Application No. 22189761.4-1103 dated Jan. 11, 2023.

Vardelle, et al., Experimental Investigation of Powder Vaporization in Thermal Plasma Jets, 6052 Plasma Chemistry and Plasma Processing Jun. 11, 1991, No. 2, New York, US.

* cited by examiner

DISCHARGE METHOD, DISCHARGE SYSTEM AND SUBSTRATE PROCESSING APPARATUS INCLUDING THE SAME

This application claims priority to Korean Patent Application No. 10-2021-0107204, filed on Aug. 13, 2021, and all the benefits accruing therefrom under 35 U.S.C. § 119, the content of which in its entirety is herein incorporated by reference.

BACKGROUND

1. Field

Embodiments of the invention relate to a discharge method, a discharge system, and a substrate processing apparatus including the same. More specifically, embodiments of the invention relate to a method of discharging process by-products in a manufacturing process of a display device, a process by-product discharge system for performing the method of discharging the process by-products, and a substrate processing apparatus including the same.

2. Description of the Related Art

A flat panel display device is replacing a cathode ray tube display device due to characteristics of the flat panel display device such as light weight and slim structure. The flat panel display devices include a liquid crystal display device and an organic light-emitting display device, for example.

Discharge products generated in the manufacturing process of the display device may be discharged to a scrubber installed outside through a discharge line, and may be discharged to the atmosphere after being purified in the scrubber. The discharge products may include process by-products in a form of powder in addition to emissions having a gaseous state.

SUMMARY

When process by-products in a form of powder are deposited inside a discharge line, the discharge line may be clogged so that emissions may be leaked.

A feature of the invention is to provide a discharge method capable of reducing the cost and improving stability.

Another feature of the invention is to provide a discharge system capable of reducing the cost and improving stability.

Still another feature of the invention is to provide a substrate processing apparatus capable of reducing the cost and improving stability.

Additional features of the invention will be set forth in the description which follows, and in part will be apparent from the description, or may be learned by practice of the invention.

A discharge method in an embodiment may include discharging discharge products including a first discharge gas and solid by-products from a process chamber, in which a substrate processing process is performed in a vacuum state, into an inside of a collection device, collecting the solid by-products in the collection device, introducing a portion of a second discharge gas discharged from a load lock chamber into the collection device, and vaporizing the solid by-products in the collection device and discharging vaporized solid by-products to an outside of the collection device.

In an embodiment, the solid by-products may be vaporized by reacting with the portion of the second discharge gas in the collection device.

In an embodiment, the second discharge gas may have a moisture content higher than a moisture content of an atmosphere.

In an embodiment, a pressure of the first discharge gas discharged from the process chamber may be lower than a pressure of the second discharge gas discharged from the load lock chamber.

In an embodiment, an atmospheric air may be introduced into the inside of the collection device together with the portion of the second discharge gas. The solid by-products may be vaporized by reacting with the atmospheric air or the portion of the second discharge gas in the collection device.

In an embodiment, a pressure of the first discharge gas discharged from the process chamber may be lower than each of a pressure of the second discharge gas discharged from the load lock chamber and an atmospheric pressure.

A discharge system which performs discharging of discharge products including a first discharge gas and solid by-products, discharging of a second discharge gas, collecting of the solid by-products, vaporizing of collected solid by-products and discharging of vaporized solid by-products in an embodiment may include a first pump for discharging the discharge products including the first discharge gas and the solid by-products from a process chamber in which a substrate processing process is performed in a vacuum state, a second pump for discharging the second discharge gas from a load lock chamber, a collection device which is connected to the first pump, collects the solid by-products from the discharge products discharged from the first pump and vaporizes the collected solid by-products to discharge the vaporized solid by-products to a scrubber, and an inlet device which is connected to the second pump and the collection device and introduces a portion of the second discharge gas discharged from the second pump into the collection device.

In an embodiment, the solid by-products may be vaporized by reacting with the portion of the second discharge gas in the collection device.

In an embodiment, the second discharge gas may have a moisture content higher than a moisture content of an atmosphere.

In an embodiment, a pressure of the first discharge gas discharged from the first pump may be lower than a pressure of the second discharge gas discharged from the second pump.

In an embodiment, the inlet device may introduce an atmospheric air into the collection device together with the portion of the second discharge gas. The solid by-products may be vaporized by reacting with the atmospheric air or the portion of the second discharge gas in the collection device.

In an embodiment, a pressure of the first discharge gas discharged from the first pump may be lower than each of a pressure of the second discharge gas discharged from the second pump and an atmospheric pressure.

In an embodiment, the discharge system may further include a discharge line which is connected to the second pump and discharges the second discharge gas discharged from the second pump to the scrubber. The inlet device may include a first inlet connected to the discharge line to receive the portion of the second discharge gas, and a discharge port which is connected to the collection device and discharges the portion of the second discharge gas into the collection device.

In an embodiment, an internal pressure of the collection device may be lower than an internal pressure of the discharge line.

In an embodiment, the collection device may include a first inlet connected to the first pump to receive the discharge products, a second inlet connected to the discharge port of the inlet device to receive the portion of the second discharge gas, and a discharge port which discharges the first discharge gas and gaseous by-products, which are produced as the solid by-products are vaporized, to the scrubber.

In an embodiment, the inlet device may further include a second inlet exposed to an outside to receive an atmospheric air.

In an embodiment, an internal pressure of the collection device may be lower than each of an internal pressure of the discharge line and an atmospheric pressure.

A substrate processing apparatus which performs discharging of discharge products including a first discharge gas and solid by-products generated by processing a substrate, discharging of a second discharge gas, collecting of the solid by-products, vaporizing of collected solid by-products and discharging of vaporized solid by-products in an embodiment may include a process chamber in which an internal space where a substrate processing process is performed in a vacuum state is defined, a load lock chamber which is connected to the process chamber and in which an internal space where the substrate stays before or after the substrate processing process is performed is defined, a first pump for discharging the discharge products including the first discharge gas and the solid by-products from the process chamber, a second pump for discharging the second discharge gas from the load lock chamber, a collection device which is connected to the first pump, collects the solid by-products from the discharge products discharged from the first pump and discharges the collected solid by-products by vaporizing the collected solid by-products, an inlet device which is connected to the second pump and the collection device, and introduces a portion of the second discharge gas discharged from the second pump into the collection device, and a scrubber connected to the collection device and the second pump.

In an embodiment, the solid by-products may be vaporized by reacting with the portion of the second discharge gas in the collection device.

In an embodiment, the inlet device may introduce an atmospheric air into the collection device together with the portion of the second discharge gas. The solid by-products may be vaporized by reacting with the portion of the second discharge gas and the atmospheric air in the collection device.

The substrate processing apparatus in embodiments of the invention includes a collection device for collecting solid by-products in the form of powder among the discharge products discharged from the process chamber, and the inlet device connected to the collection device to introduce the inlet gas into the collection device. The solid by-products collected inside the collection device may be vaporized through the reaction with the inlet gas. Accordingly, the substrate processing apparatus may prevent the discharge line disposed at the rear end of the collection device from being clogged. Accordingly, leakage of gas from the discharge line may be prevented, and stability of the substrate processing apparatus may be improved.

In addition, the inlet gas may include a portion of discharge gas discharged from the load lock chamber and an atmospheric air. Accordingly, the substrate processing apparatus does not use a separate reaction gas desired for vaporizing the solid by-products, so the equipment cost of the substrate processing apparatus may be reduced and stability may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

DETAILED DESCRIPTION

Figure 1:
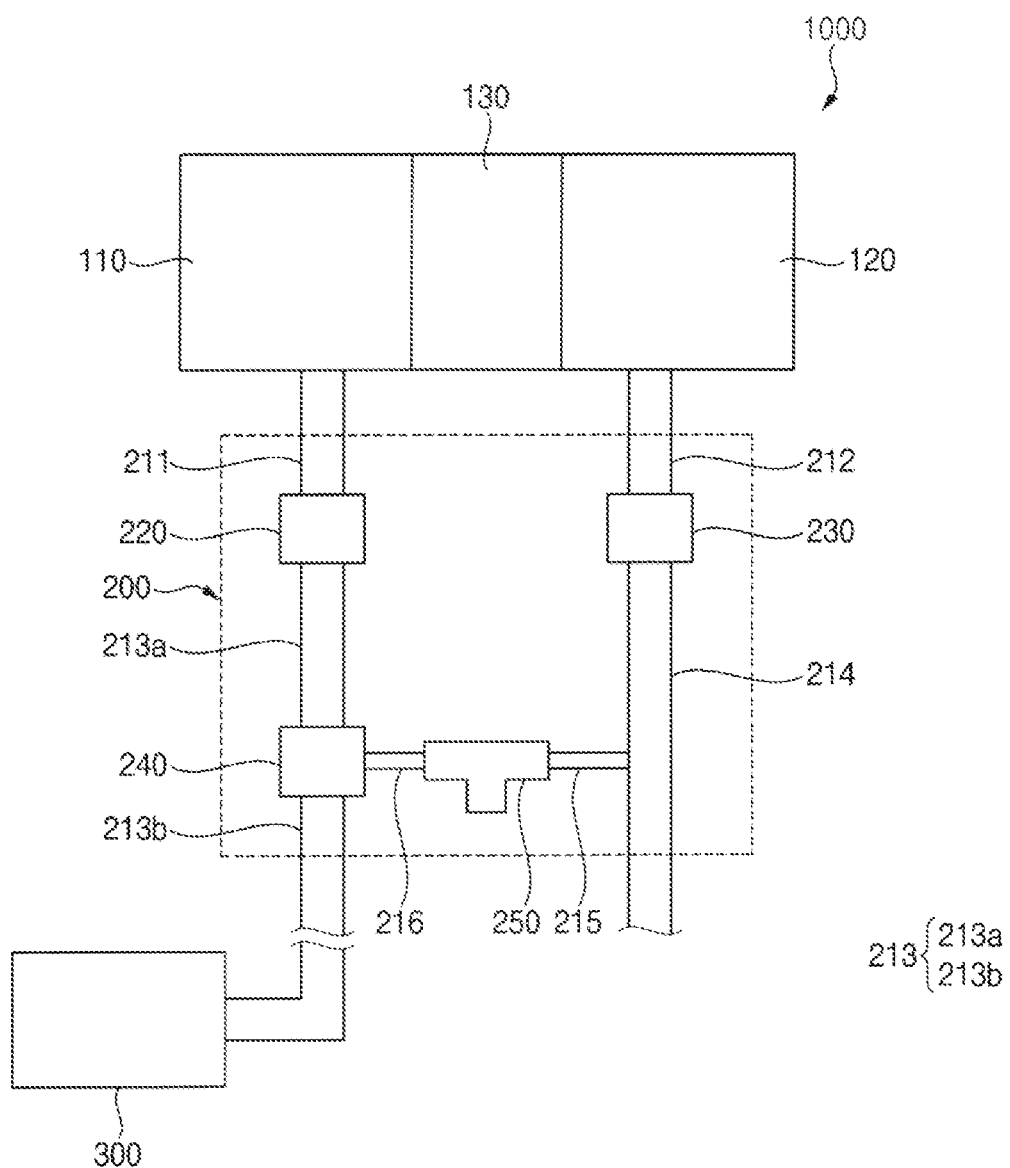
FIG. 1 is a view showing an embodiment of a configuration of a substrate processing apparatus according to the invention.

Illustrative, non-limiting embodiments will be more clearly understood from the following detailed description in conjunction with the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a view showing a configuration of a substrate processing apparatus according to the invention.

Referring to FIG. 1, a substrate processing apparatus 1000 in an embodiment of the invention may include a process chamber 110, a load lock chamber 120, a transfer chamber 130, a discharge system 200, and a scrubber 300.

An internal space where various processing processes (e.g., an etching process, a deposition process, a heat treatment process, etc.) for a substrate are performed may be defined in the process chamber 110. In an embodiment, the substrate to be processed by the substrate processing apparatus 1000 may be a substrate of an electronic device, a substrate of a display device, or a substrate of an intermediate product thereof, for example.

An internal space where the substrate stays before or after a substrate processing process is performed may be defined in the load lock chamber 120. In an embodiment, the load lock chamber 120 may include a loading chamber and an unloading chamber, for example. An internal space where the substrate stays may be defined in each of the loading chamber and the unloading chamber. The substrate may temporarily stay in the loading chamber before the substrate is loaded into the process chamber 110 for a substrate processing process. The substrate unloaded from the process chamber 110 after the substrate processing process is completed may temporarily stay in the unloading chamber.

The transfer chamber 130 may be disposed between the process chamber 110 and the load lock chamber 120. The load lock chamber 120 may be connected to the process chamber 110 through the transfer chamber 130. In an embodiment, one transfer chamber 130 may be connected to a plurality of process chambers 110, for example.

A transfer robot for transferring the substrate may be disposed inside the transfer chamber 130. The transfer robot may transfer the substrate in the load lock chamber 120 into the process chamber 110 or transfer the substrate in the process chamber 110 into the load lock chamber 120.

The substrate processing process may be performed in a vacuum state. In an embodiment, the internal space of the process chamber 110 may always be maintained in a vacuum state, for example.

The internal space of the load lock chamber 120 may repeatedly have a vacuum state and an atmospheric pressure state. In an embodiment, when the substrate is loaded into the load lock chamber 120 from the outside (e.g., a load port (not shown)) before the substrate processing process is performed, or when the substrate is unloaded to the outside from to the load lock chamber 120 after the substrate processing process is performed, the internal space of the load lock chamber 120 may have an atmospheric pressure state, for example. In addition, when the substrate is unloaded from the load lock chamber 120 into the transfer chamber 130 before the substrate processing process is performed, or when the substrate is loaded from the transfer chamber 130 into the load lock chamber 120 after the substrate processing process is performed, the internal space of the load lock chamber 120 may have a vacuum state.

The discharge system 200 may pump the internal air of each of the chambers 110, 120, and 130 to make a vacuum state in the internal space of each of the chambers 110, 120, and 130. For the purpose of convenience, only a first pump 220 for pumping the internal air of the process chamber 110 and a second pump 230 for pumping the internal air of the load lock chamber 120 are shown in the drawing, but the discharge system 200 may further include a pump for pumping the internal air of the transfer chamber 130.

The discharge system 200 may discharge the discharge products from the process chamber 110 in which the substrate processing process is performed to the scrubber 300. The discharge products may include various kinds of gases (e.g., at least one of source gas, purge gas, etc.) discharged after being used in the substrate processing process, and process by-products in the form of powder (hereinafter, solid by-products) generated during the substrate processing process. When the solid by-products are deposited on the inner surface of the discharge line, the discharge line may be clogged. For this reason, the discharge system 200 may convert the solid by-products in the form of the powder (that is, vaporizes the solid by-products) into gaseous process by-products (hereinafter, gaseous by-products) in order to discharge the gaseous by-products to the scrubber 300 together with the discharge gas. This will be described below in detail.

The scrubber 300 may purify the gaseous by-products and the discharge gas discharged from the discharge system 200. In an embodiment, the scrubber 300 may decompose the gaseous by-products and the discharge gas to remove harmful substances and then discharge the gaseous by-products and the discharge gas which are decomposed to the atmosphere, for example.

Figure 2:
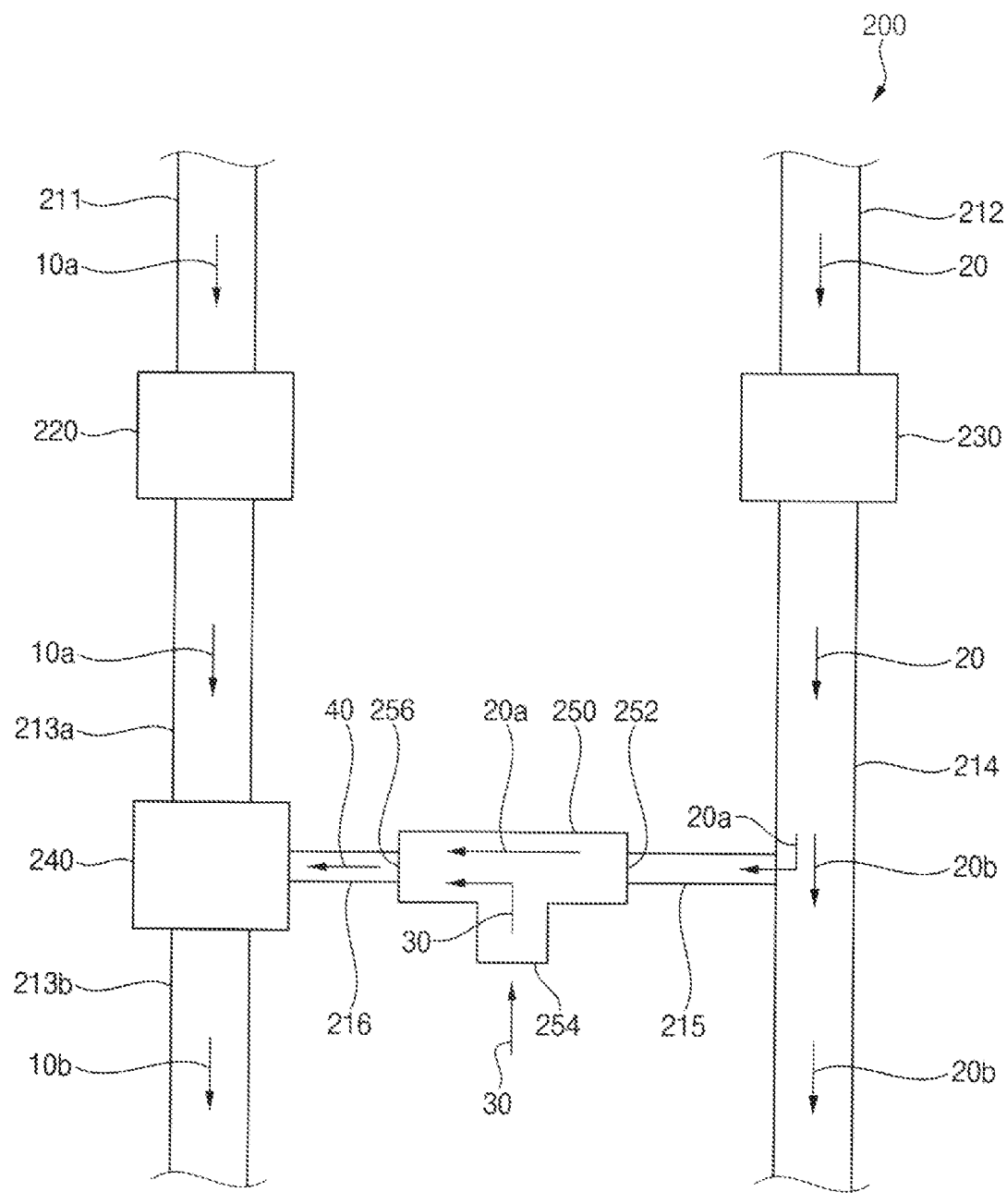
FIG. 2 is a view showing a configuration of the discharge system included in the substrate processing apparatus of FIG. 1.
Figure 3:
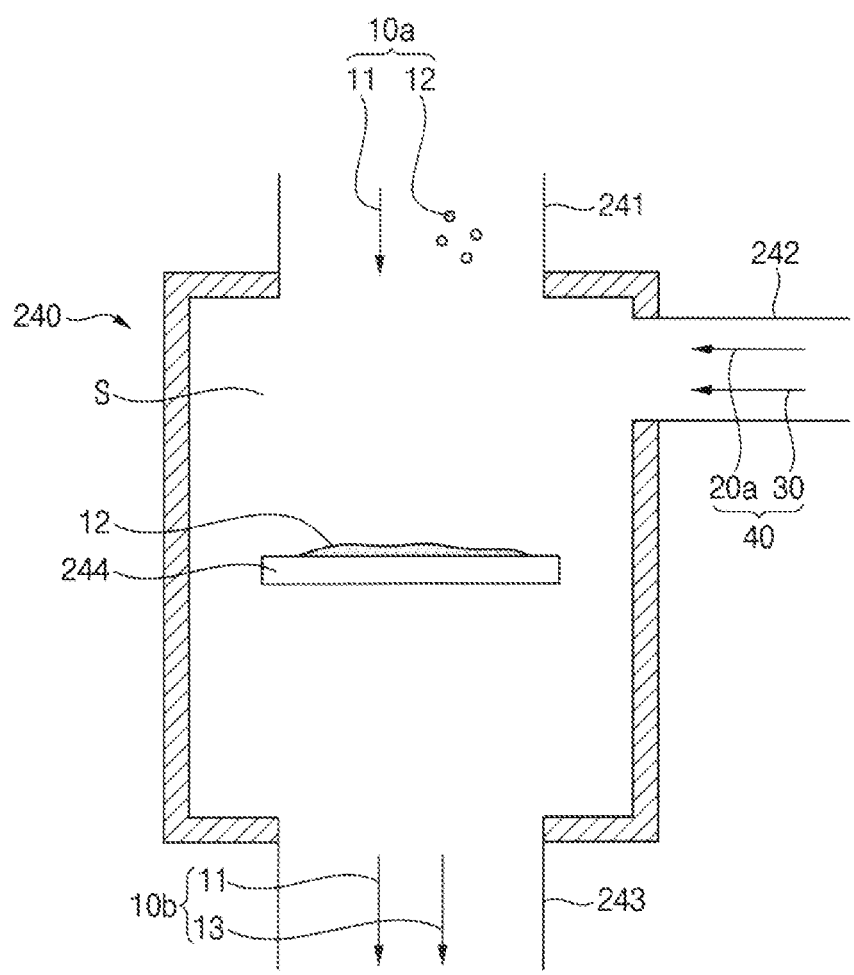
FIG. 3 is a view showing a configuration of a collection device included in the discharge system of FIG. 2.
Figure 4A:
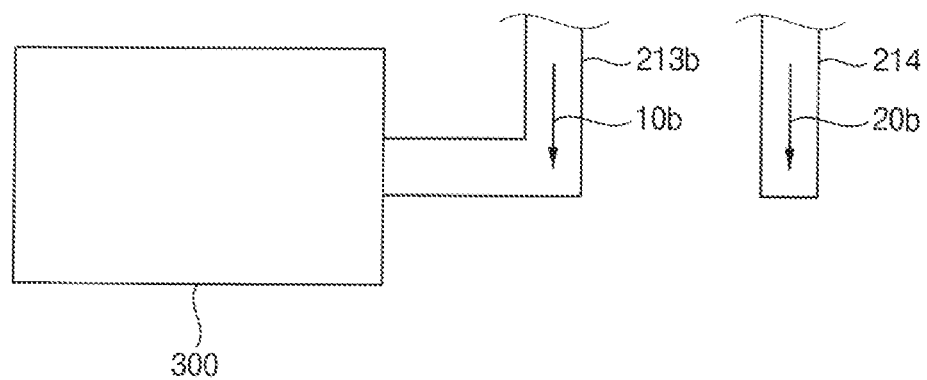
FIG. 4A is a view showing an embodiment of a configuration of a second discharge line.
Figure 4B:
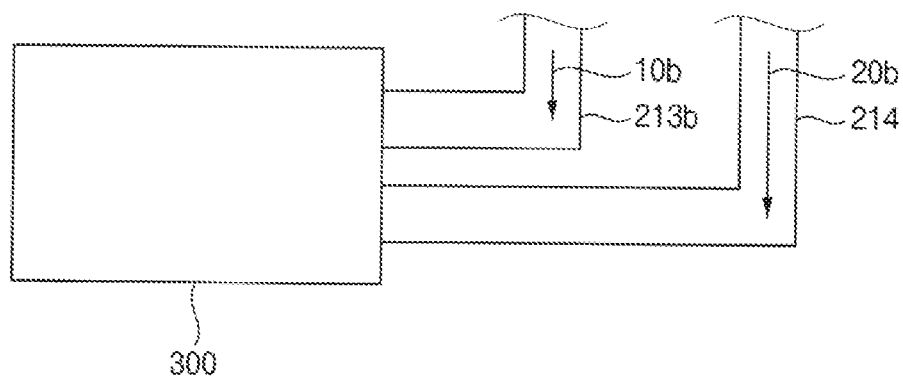
FIG. 4B is a view showing another embodiment of a configuration of the second discharge line.

FIG. 2 is a view showing a configuration of the discharge system included in the substrate processing apparatus of FIG. 1. FIG. 3 is a view showing a configuration of a collection device included in the discharge system of FIG. 2. FIG. 4A is a view showing an embodiment of a configuration of a second discharge line, and FIG. 4B is a view showing another embodiment of a configuration of the second discharge line.

Referring to FIGS. 1 to 3, in an embodiment, the discharge system 200 may include a first pump 220, a second pump 230, a collection device 240, an inlet device 250 and a plurality of lines 211, 212, 213, 214, 215, and 216.

The first pump 220 may be connected to the process chamber 110 through the first pumping line 211. In an embodiment, the first pump 220 may continuously pump the internal air of the process chamber 110, for example. Accordingly, the internal space of the process chamber 110 may always be maintained in a vacuum state.

The discharge products 10a and 10b may be discharged to the scrubber 300 along the first pumping line 211 and the first discharge line 213 from the inside of the process chamber 110 by the pumping of the first pump 220. The discharge product 10a discharged from the process chamber 110 may include a first discharge gas 11 including various kinds of gases (e.g., at least one of source gas, purge gas, etc.) discharged after being used in the substrate processing process and solid by-products 12 in the form of powder generated during the substrate processing process.

The collection device 240 may be disposed at a middle portion of the first discharge line 213. In an embodiment, the collection device 240 may be connected to the first pumping line 211 through a 1-1 discharge line 213a, and may be connected to the scrubber 300 through a 1-2 discharge line 213b, for example. That is, the collection device 240 may be disposed between the first pump 220 and the scrubber 300.

The collection device 240 may collect the solid by-products 12 from the discharge product 10a introduced through the 1-1 discharge line 213a, and vaporize the collected solid by-products 12. In an embodiment, the solid by-products 12 may be vaporized by reacting with the inlet gas 40 which is introduced into the inside of the collection device 240 by the inlet device 250. The collection device 240 may discharge the gaseous by-products 13, which are produced as the solid by-products 12 are vaporized, to the scrubber 300 together with the first discharge gas 11 through the 1-2 discharge line 213b. The collection device 240 will be described below in detail.

The second pump 230 may be connected to the load lock chamber 120 through the second pumping line 212. In an embodiment, the second pump 230 may temporarily pump the internal air of the load lock chamber 120, for example. Accordingly, the internal space of the load lock chamber 120 may repeatedly have a vacuum state and an atmospheric pressure state.

The second discharge gas 20 may be discharged to the outside from the inside of the load lock chamber 120 along the second pumping line 212 and the second discharge line 214 by the pumping of the second pump 230. In an embodiment, as shown in FIG. 4A, the second discharge gas 20 may be discharged to the atmosphere. In another embodiment, as shown in FIG. 4B, a rear end of the second discharge line 214 may be connected to the scrubber 300, and the second discharge gas 20 may be discharged to the scrubber 300.

In an embodiment, the second discharge gas 20 discharged from the inside of the load lock chamber 120 may have a moisture content higher than a moisture content of the atmosphere.

The inlet device 250 may be connected to each of the second outlet line 214 and the collection device 240. That is, the inlet device 250 may be connected to each of the second pump 230 and the collection device 240. The inlet device 250 may introduce the inlet gas 40 into the collection device 240.

In an embodiment, as shown in FIG. 2, the inlet device 250 may include a first inlet 252, a second inlet 254, and a discharge port 256. In an embodiment, the inlet device 250 may be an ejector having a T-shape, for example. However, the invention is not limited thereto, and the inlet device 250 may have various other shapes.

The first inlet 252 may be connected to the second discharge line 214 through the first connection line 215. A portion 20a of the second discharge gas 20 discharged along the second discharge line 214 may be introduced into the inside of the inlet device 250 through the first connection line 215 and the first inlet 252, and the remainder 20b may be discharged to the outside (e.g., to the atmosphere as shown in FIG. 4A or to the scrubber 300 as shown in FIG. 4B) along the second discharge line 214.

In an embodiment, the second inlet 254 may be exposed to the outside (e.g., to the atmosphere). An atmospheric air 30 may be introduced into the inlet device 250 through the second inlet 254. In another embodiment, the second inlet 254 may be connected to a separate gas supply device (not shown), and a predetermined amount of gas supplied from the gas supply device may be introduced into the inlet device 250 through the second inlet 254.

The discharge port 256 may be connected to the collection device 240 through the second connection line 216. The discharge port 256 may discharge the inlet gas 40 including the portion 20a of the second discharge gas introduced into the inlet device 250 and the atmospheric air 30 to the outside of the inlet device 250. The inlet gas 40 discharged from the discharge port 256 may be introduced into the collection device 240 through the second connection line 216.

In an embodiment, the portion 20a of the second discharge gas may be introduced into the inlet device 250 from the second discharge line 214 due to the pressure difference between the inside of the inlet device 250 and the inside of the second discharge line 214. In addition, the portion 20a of the second discharge gas introduced into the inlet device 250 may be introduced into the collection device 240 from the inlet device 250 due to the pressure difference between the inside of the collection device 240 and the inside of the inlet device 250.

In an embodiment, the pressure of the first discharge gas 11 discharged from the process chamber 110 by the first pump 220 may be lower than the pressure of the second discharge gas 20 discharged from the load lock chamber 120 by the second pump 230, for example. Accordingly, the internal pressure of the collection device 240 may be lower than the internal pressure of the second discharge line 214. The internal pressure of the inlet device 250 may be higher than the internal pressure of the collection device 240 and lower than the internal pressure of the second discharge line 214. Therefore, the portion 20a of the second discharge gas may be introduced into the collection device 240 from the second discharge line 214 along the first connection line 215, the first inlet 252, the discharge port 256, and the second connection line 216. The portion 20a of the second discharge gas may flow in one direction without flowing back in an opposite direction.

The atmospheric air 30 may be introduced into the inlet device 250 from the atmosphere due to the pressure difference between the inside of the inlet device 250 and the atmosphere. In addition, the atmospheric air 30 introduced into the inlet device 250 may be introduced into the collection device 240 from the inlet device 250 due to the pressure difference between the inside of the collection device 240 and the inside of the inlet device 250.

In an embodiment, the pressure of the first discharge gas 11 discharged from the process chamber 110 by the first pump 220 may be lower than atmospheric pressure, for example. Accordingly, the internal pressure of the collection device 240 may be lower than the atmospheric pressure. The internal pressure of the inlet device 250 may be higher than the internal pressure of the collection device 240 and lower than atmospheric pressure. Accordingly, the atmospheric air 30 may be introduced into the collection device 240 from the atmosphere along the second inlet 254, the discharge port 256, and the second connection line 216. The atmospheric air 30 may flow in one direction without flowing back in an opposite direction.

In another embodiment, different from the configuration shown in the drawings, a gas supply device for supplying high-pressure gas may be connected to the first inlet 252 opposite to the discharge port 256, and the second discharge line 214 may be connected to the second inlet 254. The cross-sectional area of the flow path for the high-pressure gas in the inlet device 250 may gradually decrease from the first inlet 252 toward the discharge port 256 and then increase again. Accordingly, the portion 20a of the second discharge gas may be sucked to the second inlet 254 from the second discharge line 214, discharged through the discharge port 256, and introduced into the collection device 240.

In an embodiment, as shown in FIG. 3, the collection device 240 may include a first inlet 241, a second inlet 242 and a discharge port 243.

The first inlet 241 may be connected to the 1-1 discharge line 213a. The discharge product 10a including the first discharge gas 11 and the solid by-products 12 may be introduced into an internal space S of the collection device 240 from the 1-1 discharge line 213a through the first inlet 241.

A collector 244 for collecting the solid by-products 12 from the discharge product 10a may be disposed in the internal space S of the collection device 240. Various types of collectors 244 may be used without limitation as long as the collector 244 may collect the solid by-products 12 in the form of powder from the discharge product 10a. In embodiments, the various types of collectors may include a cyclone collector, a cooling collector, an electric collector, etc., for example.

The second inlet 242 may be connected to the second connection line 216. The inlet gas 40 may be introduced into the internal space S of the collection device 240 from the inlet device 250 through the second inlet 242. The inlet gas 40 introduced into the internal space S of the collection device 240 may react with the solid by-products 12 collected by the collector 244 to vaporize the solid by-products 12, or to dilute the solid by-products 12. The inlet gas 40 including the portion 20a of the second discharge gas and atmospheric air 30 may have a relatively high reactivity with the solid by-products 12. In an embodiment, the solid by-products 12 may be vaporized by reacting with at least one of nitrogen, oxygen, moisture, etc., included in the portion 20a of the second discharge gas and the atmospheric air 30, for example. In an embodiment, as the second discharge gas 20 has a relatively high moisture content, the solid by-products 12 (e.g., a powder including or consisting of a chlorine component, etc.) that is vaporized by reacting with the moisture may be effectively vaporized, for example.

The discharge port 243 may be connected to the 1-2 discharge line 213b. The discharge product 10b including the first discharge gas 11 and the gaseous by-products 13, which are produced as the solid by-products 12 are vaporized, may be discharged from the internal space S of the collection device 240 through the discharge port 243 and then discharged to the scrubber 300 along the 1-2 discharge line 213b.

In an embodiment of the invention, the collection device 240 may collect the solid by-products 12 in the form of powder among the discharge products 10a discharged from the process chamber 110. The collected solid by-products 12 may be vaporized by reacting with the inlet gas 40 introduced into the collection device 240 through the inlet device 250 connected to the collection device 240. The collection device 240 may discharge the gaseous by-products 13, which are produced as the solid by-products 12 are vaporized, to the scrubber 300 together with the first discharge gas 11. Accordingly, the substrate processing apparatus 1000 may prevent the discharge line disposed at the rear end of the collection device 240 from being clogged. Therefore, it is possible to prevent gas from leaking from the discharge line. Accordingly, stability of the substrate processing apparatus 1000 may be improved.

In addition, in an embodiment of the invention, the inlet gas 40 may include the portion 20a of the second discharge gas discharged from the load lock chamber 120 and the atmospheric air 30. In this case, since the second discharge gas 20 discharged from the load lock chamber 120 has a relatively high moisture content, the solid by-products 12 (e.g., a powder including or consisting of a chlorine component, etc.) vaporized by reacting with the moisture may be effectively vaporized. In addition, since the solid by-products 12 are vaporized by the portion 20a of the second discharge gas and the atmospheric air 30 without using a separate reaction gas to vaporize the solid by-products 12, the equipment cost of the substrate processing apparatus 1000 may be reduced, and stability may be improved.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the embodiments disclosed, and that modifications to the disclosed embodiments, as well as other embodiments, are intended to be included within the scope of the appended claims.

What is claimed is:

1. A discharge system which performs discharging of discharge products including a first discharge gas and solid by-products, discharging of a second discharge gas, collecting of the solid by-products, vaporizing of collected solid by-products and discharging of vaporized solid by-products, the discharge system comprising:
 a first pump which discharges the discharge products including the first discharge gas and the solid by-products from a process chamber in which a substrate processing process is performed in a vacuum state;
 a second pump which discharges the second discharge gas from a load lock chamber;
 a collection device which is connected to the first pump, collects the solid by-products from the discharge products discharged from the first pump, vaporizes the collected solid by-products and discharges the vaporized solid by-products to a scrubber; and
 an inlet device which is connected to the second pump and the collection device and introduces a portion of the second discharge gas discharged from the second pump into the collection device, the inlet device comprising:

a first inlet which is connected to a discharge line and receives the portion of the second discharge gas;

a second inlet which is exposed to an outside and receives an atmospheric air; and a discharge port which is connected to the collection device and discharges the portion of the second discharge gas into the collection device, wherein the first inlet is connected to the discharge line through a first connection line and the second inlet is connected to the collection device through a second connection line.

2. The discharge system of claim 1, wherein the solid by-products are vaporized by reacting with the portion of the second discharge gas in the collection device.

3. The discharge system of claim 2, wherein the second discharge gas has a moisture content higher than a moisture content of an atmosphere.

4. The discharge system of claim 1, wherein a pressure of the first discharge gas discharged from the first pump is lower than a pressure of the second discharge gas discharged from the second pump.

5. The discharge system of claim 1, wherein the inlet device introduces an atmospheric air into the collection device together with the portion of the second discharge gas, and the solid by-products are vaporized by reacting with the atmospheric air or the portion of the second discharge gas in the collection device.

6. The discharge system of claim 5, wherein a pressure of the first discharge gas discharged from the first pump is lower than each of a pressure of the second discharge gas discharged from the second pump and an atmospheric pressure.

7. The discharge system of claim 1, further comprising:

the discharge line which is connected to the second pump and discharges the second discharge gas discharged from the second pump to the scrubber.

8. The discharge system of claim 7, wherein an internal pressure of the collection device is lower than an internal pressure of the discharge line.

9. The discharge system of claim 7, wherein the collection device includes:

a first inlet which is connected to the first pump and receives the discharge products;

a second inlet which is connected to the discharge port of the inlet device and receives the portion of the second discharge gas; and a discharge port which discharges the first discharge gas and gaseous by-products, which are produced as the solid by-products are vaporized, to the scrubber.

10. The discharge system of claim 7, wherein an internal pressure of the collection device is lower than each of an internal pressure of the discharge line and an atmospheric pressure.

11. A substrate processing apparatus which performs discharging of discharge products including a first discharge gas and solid by-products generated by processing a substrate, discharging of a second discharge gas, collecting of the solid by-products, vaporizing of collected solid by-products and discharging of vaporized solid by-products, the substrate processing apparatus comprising:

a process chamber in which an internal space where a substrate processing process is performed in a vacuum state is defined;

a load lock chamber which is connected to the process chamber and in which an internal space where the substrate stays before or after the substrate processing process is performed is defined;

a first pump which discharges the discharge products including the first discharge gas and the solid by-products from the process chamber;

a second pump which discharges the second discharge gas from the load lock chamber;

a collection device which is connected to the first pump, collects the solid by-products from the discharge products discharged from the first pump and discharges the collected solid by-products by vaporizing the collected solid by-products;

an inlet device which is connected to the second pump and the collection device, and introduces a portion of the second discharge gas discharged from the second pump into the collection device, the inlet device comprising:

a first inlet which is connected to a discharge line and receives the portion of the second discharge gas; and a second inlet which is exposed to an outside and receives an atmospheric air;

a discharge port which is connected to the collection device and discharges the portion of the second discharge gas into the collection device; and a scrubber connected to the collection device and the second pump, wherein the first inlet is connected to the discharge line through a first connection line and the second inlet is connected to the collection device through a second connection line.

12. The substrate processing apparatus of claim 11, wherein the solid by-products are vaporized by reacting with the portion of the second discharge gas in the collection device.

13. The substrate processing apparatus of claim 11, wherein the inlet device introduces the atmospheric air into the collection device together with the portion of the second discharge gas, and the solid by-products are vaporized by reacting with the portion of the second discharge gas and the atmospheric air in the collection device.

* * * * *